US012652042B2

(12) United States Patent
Pinzin et al.

(10) Patent No.: US 12,652,042 B2
(45) Date of Patent: Jun. 9, 2026

(54) POWER MOSFET DRIVER CIRCUIT ARRANGEMENT AND CORRESPONDING CONTROL METHOD

(71) Applicant: STMicroelectronics S.r.l., Agrate Brianza (IT)

(72) Inventors: Francesco Pinzin, Varese (IT); Alessandro Bertolini, Vermiglio (IT); Alberto Cattani, Cislago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 115 days.

(21) Appl. No.: 18/630,493

(22) Filed: Apr. 9, 2024

(65) Prior Publication Data

US 2024/0348249 A1    Oct. 17, 2024

(30) Foreign Application Priority Data

Apr. 11, 2023    (IT) ........................ 102023000006951

(51) Int. Cl.
| | |
|---|---|
| *H03K 17/687* | (2006.01) |
| *H02M 1/088* | (2006.01) |
| *H02M 3/157* | (2006.01) |
| *H02M 3/158* | (2006.01) |

(52) U.S. Cl.
CPC ........ *H03K 17/6871* (2013.01); *H02M 1/088* (2013.01); *H02M 3/157* (2013.01); *H02M 3/158* (2013.01)

(58) Field of Classification Search
CPC .. H03K 17/6871; H02M 1/088; H02M 3/157; H02M 3/158
See application file for complete search history.

(56) References Cited

U.S. PATENT DOCUMENTS

| | | | |
|---|---|---|---|
| 8,258,822 | B2 | 9/2012 | Tumminaro et al. |
| 2003/0180997 | A1 | 9/2003 | Nakayama et al. |
| 2011/0050322 | A1* | 3/2011 | Sicard .................. H03K 17/164 |
| | | | 327/419 |
| 2015/0022258 | A1 | 1/2015 | Sadate et al. |

FOREIGN PATENT DOCUMENTS

EP           3799308 A1      3/2021

OTHER PUBLICATIONS

IT Search Report and Written Opinion for priority application, IT Appl. No. 102023000006951, report dated Oct. 11, 2023, 7 pgs.

* cited by examiner

*Primary Examiner* — Menatoallah Youssef
*Assistant Examiner* — Colleen J O Toole
(74) *Attorney, Agent, or Firm* — Crowe & Dunlevy LLC

(57) ABSTRACT

A power MOSFET driver circuit includes a feedback circuit configured to supply a feedback signal that signals when a gate voltage of the power MOSFET crosses a plateau value and the power MOSFET switches conduction state. The feedback circuit includes a comparator with a replica MOSFET of the power MOSFET, with scaled down dimensions, whose gate is coupled to the gate electrode of the power MOSFET. A bistable circuit has an input coupled to an output of the replica MOSFET and is configured to change a logic state of the feedback signal following the transition of the switching signal when the gate voltage of the power MOSFET crosses the plateau value and the power MOSFET switches conduction state.

20 Claims, 7 Drawing Sheets

Fig. 4

POWER MOSFET DRIVER CIRCUIT ARRANGEMENT AND CORRESPONDING CONTROL METHOD

PRIORITY CLAIM

This application claims the priority benefit of Italian Application for Patent No. 102023000006951 filed on Apr. 11, 2023, the content of which is hereby incorporated by reference in its entirety to the maximum extent allowable by law.

TECHNICAL FIELD

Embodiments of the present disclosure relate to a power MOSFET driver circuit arrangement, in particular comprised in a DC-DC converter, comprising at least one power MOSFET controlled in its switching states by a switching signal at its gate electrode arranged to operate between a DC input voltage and a lower DC reference voltage, which comprises a feedback circuit configured to supply a feedback signal signaling the passing of a plateau value of a gate voltage of said at least one power MOSFET.

Embodiments of the present disclosure relate in particular to a slew-rate control mode, but it can be used also without any slew-rate control scheme. Embodiments of the present disclosure relate in particular to drivers of DC-DC converters, in particular for AMOLED driving, in particular to an implementation in a high-side floating driver of a buck DC-DC converter.

BACKGROUND

Power MOSFET drivers are known to present a so-called Miller plateau. This refers to the phenomena when a power MOSFET switches, its gate voltage is actually clamped to a plateau voltage and remains there until sufficient charge has been added or removed for the power MOSFET to switch.

The control logic needs thus a feedback signal which precisely reports the actual turn-off of the power MOSFET.

When such plateau phase is concluded the slope of the variation in time of the power MOSFET gate voltage depends by the injected current value, which depends on the capacitances of the gate source Cos and gate drain CGD of the power MOSFET. It is advisable to increase such a slope to quickly charge such capacitors, and, in order to reduce power consumption, minimizing as quickly as possible the power MOSFET on resistance R_DSon (i.e., the drain source resistance when the MOSFET is conducting is the ohmic region).

To attempt to obtain this, it is known to use a comparator with a fixed threshold to evaluate such gate voltage.

A shifted-threshold comparator can also be used, where the gate electrode of the power MOSFET is coupled to the input of an inverter with an unbalanced form factor in order to delay its commutation until the power MOSFET has concluded its plateau region.

A drawback of the fixed threshold comparator is that the possible variations of the power MOSFET threshold are independent from the possible variations of the threshold value of the comparator. In addition, its commutation time must be considered as well. The inverter with shifted threshold suffers of the same problems of the previous one.

Both the solutions can suffer of anticipated commutation that leads to lose the slew-rate control.

On the basis of the foregoing, the need is felt for solutions which overcome one or more of the previously outlined drawbacks.

SUMMARY

One or more embodiments herein concern a circuit.

Embodiments moreover concern a related control method.

As mentioned in the foregoing, the present disclosure provides solutions regarding a power MOSFET driver circuit arrangement, in particular comprised in a DC-DC converter, comprising a power MOSFET driver comprising at least a power MOSFET controlled in its switching states by a switching signal, applied at its gate electrode, arranged to operate between two DC voltage levels comprising a high DC voltage level and a low DC voltage level, in particular a DC supply voltage, and a lower DC reference voltage, in particular a ground reference or floating ground reference. Said at least one power MOSFET has a gate voltage which value as a function of time presents a plateau, in particular a Miller plateau, when, upon a transition in said switching signal switching from one DC voltage level to the other, said power MOSFET switches its conduction state, from an ON to an OFF state or viceversa. The power MOSFET driver circuit comprises a feedback circuit configured to supply a feedback signal signaling, when, following the transition of the switching signal, the gate voltage of at least a power MOSFET of said power MOSFET driver crosses said plateau value and switches conduction state.

The feedback circuit comprises: one or more comparator circuits comprising at least a MOSFET which is a replica of said at least one power MOSFET, with scaled down dimensions, whose gate is coupled to the gate electrode of said at least one power MOSFET; and a bistable circuit, which input is coupled to an output of said MOSFET replica of said at least one power MOSFET, configured to change the logic state of an output feedback signal when, following the transition of said switching signal said at least one power MOSFET crosses said plateau value and switches conduction state.

In variant embodiments, said one or more comparator circuits comprises a circuit, which input is coupled to an output of said MOSFET replica of said at least one power MOSFET, configured to couple said gate electrode to the DC voltage level reached by said switching signal after said transition.

In variant embodiments, said circuit, which input is coupled to an output of said MOSFET replica of said at least one power MOSFET, configured to couple said gate electrode to the DC voltage level reached by said switching signal after said transition, comprises a MOSFET coupling said output of said MOSFET replica to the ON DC voltage level of said at least one power MOSFET.

In variant embodiments, said feedback circuit comprises: one or more comparator circuits comprising a comparator circuit comprising two MOSFETs which are a replica of said at least one power MOSFET, a first MOSFET whose gate is coupled to the gate electrode of said at least one power MOSFET, and a second MOSFET coupled in series between said first MOSFET and the DC voltage level corresponding to the OFF level for said at least one power MOSFET; and said bistable circuit comprises a bistable latch which inputs are coupled to the gate and to the output of said first MOSFET replica of said at least one power MOSFET respectively, said output feedback signal being taken on an output of said bistable latch.

In variant embodiments, said inputs of the bistable latch are coupled to the ON DC voltage level of said at least one power MOSFET by respective MOSFET switches coupled to the output and gate of said MOSFET replica.

In variant embodiments, said driver comprises a set of switches to couple a current generator to the output of said MOSFET replica and to decouple said a MOSFET coupling said output of said MOSFET replica to the ON DC voltage level of said at least one power MOSFET, said current generator configured to supply a current to bring the replica MOSFET to the OFF DC voltage level of said at least one power MOSFET to perform a reset of the comparator.

In variant embodiments, said feedback circuit comprises: one or more comparator circuits comprising a comparator circuit comprising one MOSFET which is a replica of said at least one power MOSFET, whose gate is coupled to the gate electrode of said at least one power MOSFET; and said bistable circuit comprises an inverting circuit which input is coupled to the output of said first MOSFET replica of said at least one power MOSFET respectively, said output feedback signal being taken at the output of said inverting circuit. Said circuit, which input is coupled to an output of said MOSFET replica of said at least one power MOSFET, is configured to couple said gate electrode to the DC voltage level reached by said switching signal switching from one DC voltage level to the other, comprising a MOSFET coupling said gate of said at least one power MOSFET to its OFF DC voltage level of said at least one power MOSFET, coupled through said inverting circuit, the gate of said MOSFET being coupled to said output of said MOSFET replica through said inverting circuit.

In variant embodiments, said driver comprises a set of switches to couple a current generator to the output of said replica MOSFET, configured to supply a current to bring the replica MOSFET to the OFF DC voltage level of said at least one power MOSFET to perform a reset of the comparator.

In variant embodiments, said MOSFET which is a replica of said at least one power MOSFET, with scaled down dimensions, is configured with a scaled aspect ratio, and in particular configured to have a Miller plateau with substantially same parameters, in particular same threshold voltage and over-drive voltage at the Miller plateau.

In variant embodiments, said at least one power MOSFET is a p-channel MOSFET, said ON DC level is a low DC voltage, in particular ground or floating ground of a floating rail, said OFF DC level is a high DC voltage, in particular the high DC voltage supply voltage or the high DC voltage of a floating rail.

In variant embodiments, said at least one power MOSFET is an n-channel MOSFET, said ON DC level is a high DC voltage, in particular the high DC voltage supply voltage of the driver circuit, said OFF DC level is low DC voltage, in particular the ground node of the driver circuit.

In variant embodiments, said driver circuit comprises a high side power MOSFET, in particular a p-channel MOS-FET, and a low side power MOSFET, in particular an n-channel MOSFET, said low side power MOSFET receiving a low side input voltage from a low side driver and the high side power MOSFET receiving a high side driving voltage from a high side driver comprising said feedback circuit, said first feedback signal and/or second feedback signal being outputted to a logic module, also receiving a loop feedback signal from a control loop which is coupled to the driver output, said logic module being configured to output then a low side logic signal to the low side driver block and a high side logic signal to the high side driver block.

In variant embodiments, said driver circuit comprises a high side power MOSFET, in particular a p-channel MOS-FET, and a low side power MOSFET, in particular an n-channel MOSFET, said low side power MOSFET receiving a high side input voltage from a high side driver and the low side power MOSFET receiving a high side driving voltage from a high side driver comprising said feedback circuit, said first feedback signal and/or second feedback signal being outputted to a logic module, also receiving a loop feedback signal from a control loop which is coupled to the driver output, said logic module being configured to output then a high side logic signal to the high side driver block and a low side logic signal to the low side driver block.

In variant embodiments, said logic module comprises a finite state machine, which operates on the change of the feedback signal and second feedback signal to reset said comparator circuits.

The present disclosure provides also solutions regarding a control method of a power MOSFET driver arrangement according to embodiments, comprising feeding the first feedback signal, and/or second feedback signal, to a logic control module, controlling the operation of the driver, in particular according to a slew rate control scheme, in particular said control module controlling also switches setting the configuration of said feedback module.

In variant embodiments, said method comprises: feeding the first feedback signal and/or second feedback signal to said finite state machine; issuing from the finite state machine the low side logic signal and the high side logic signal activating the switch on and switch off of the low side power MOSFET and high side power MOSFET respectively, generated by the finite state machine; and generating on the basis of said first feedback signal and/or second feedback signal and of the high side logic signal or low side logic signal corresponding to the at least one power MOS-FET coupled to the feedback circuit signals commanding the opening and closure state of said set of switches to reset the corresponding comparator and of switches driven with complementary signals to drive the gate of the at least one power MOSFET.

BRIEF DESCRIPTION OF THE DRAWINGS

Embodiments of the present disclosure will now be described with reference to the annexed drawings, which are provided purely by way of non-limiting example and in which:

FIG. 4 represents an implementation of the power driver circuit according to embodiments;

DETAILED DESCRIPTION

In the following description, numerous specific details are given to provide a thorough understanding of embodiments.

The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figures parts, elements or components which have already been described with reference to previous figures are denoted by the same references previously used in such figures; the description of such previously described elements will not be repeated in the following in order not to overburden the present detailed description.

The solution here described refers to a circuit arrangement that allows to detect the conclusion of a plateau (Miller) region during the turn-off (or turn-on) of a power MOSFET in a DC-DC converter and provide a detection signal which can be then used in the control of the driver. It has been designed for slew-rate control mode, but it can be used also without any slew-rate control scheme. It can be used in every driver of DC-DC converters. The exemplary embodiment here described regards a high-side (HS) floating driver of a buck DC-DC converter. At least a feedback signal is generated which may be used, by a control logic, to ensure the subsequent actual turn-on (turn-off) of the power MOSFET, especially in current slew-rate control conditions. This circuit can be used in every high-side or low-side driver MOSFET.

Figure 1:
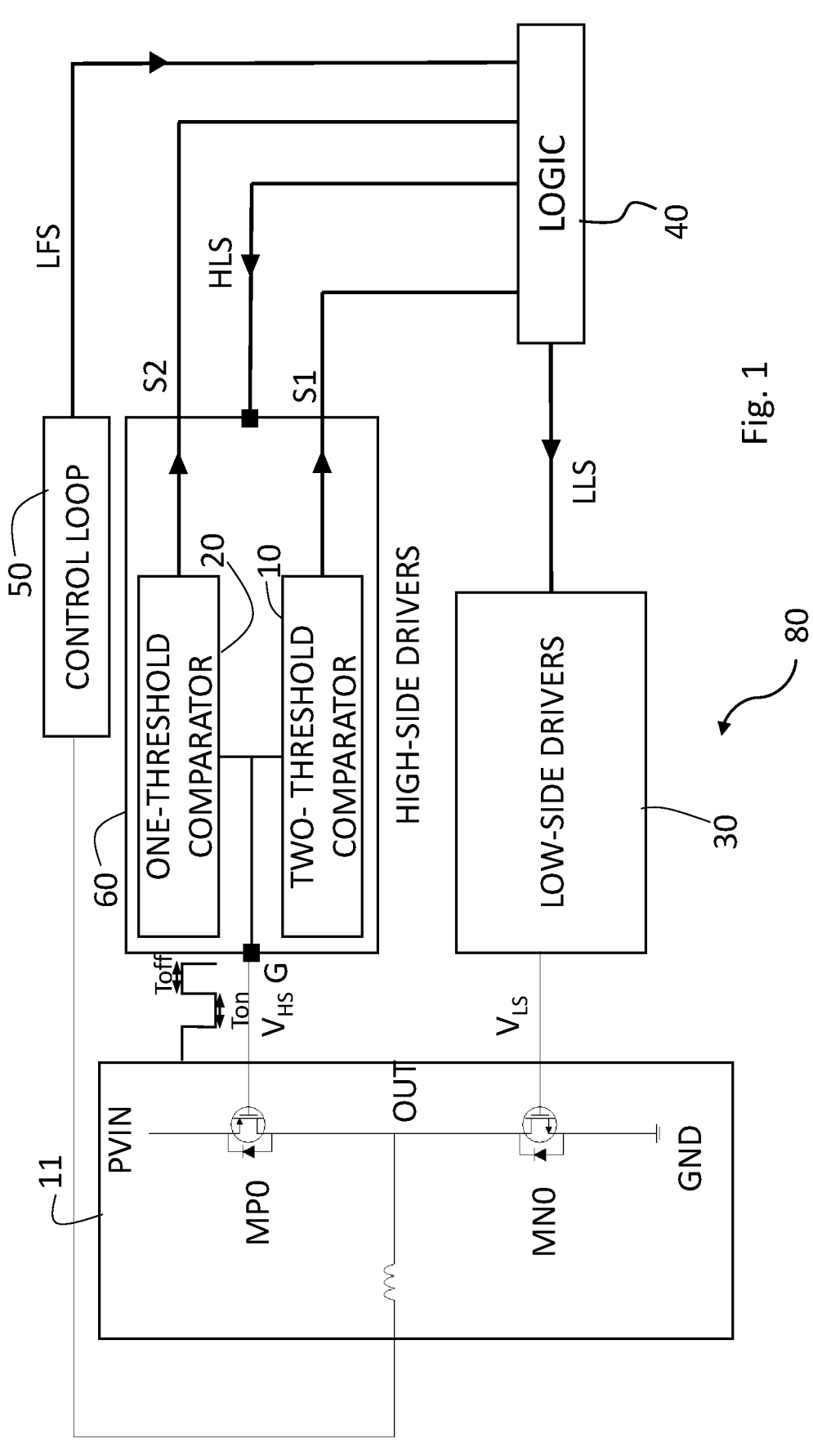
FIG. 1 represents schematically a power driver circuit according to embodiments.

To this regard, FIG. 1 schematically represents the architecture of a circuit arrangement of a driver 80 with feedback which includes a driver circuit 11 comprising a high side power MOSFET MP0, which is a p channel MOSFET, and a low side power MOSFET MN0, which is an n channel MOSFET. The driver circuit 11 receives an input voltage VIN on the source of high side MOSFET MP0 while the source of the low side MOSFET MN0 is coupled to ground GND, e.g. 0V. The low side power MOSFET MN0 receives a low side input voltage $V_{LS}$ from a low side driver 30. The high side power MOSFET MP0 receives a high side driving voltage VHS on an input gate node G, i.e., gate electrode, to which the inputs of a two-threshold comparator 20 and of a single (or one-) threshold comparator 10 are coupled. The two-threshold comparator 10 outputs a first feedback signal S1 to a logic module 40 and the one threshold comparator 20 outputs a second feedback signal S2 to such logic module 40. The logic module 40 also receives a loop feedback signal LFS from a control loop 50 which is coupled to the driver 11 output OUT. The logic module 40 outputs then a low side logic signal LLS to the low side driver block 30 and a high side logic signal HLS to the high side driver block 60 comprising the two-threshold comparator 10 and the single threshold comparator 20.

Figure 2:
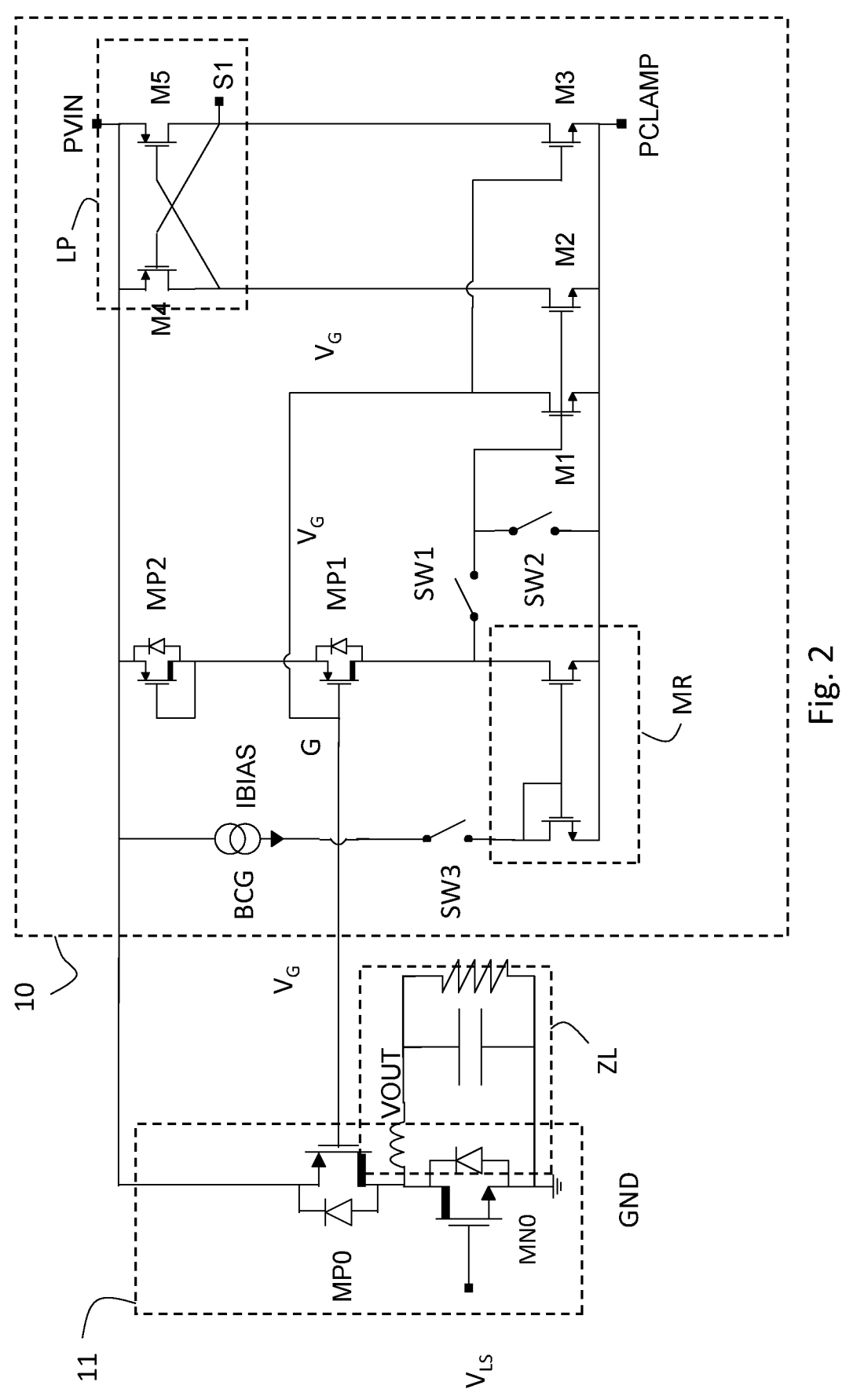
FIG. 2 represents schematically a first sub-circuit of the power driver circuit according to embodiments.

FIG. 2 shows schematically the circuit architecture of the two-threshold comparator 10, which is shown associated to the power driver 11 which includes the high side p channel MOSFET MP0 and a low side n channel MOSFET MN0, on which common node OUT, as shown in FIG. 2 where an output load ZL (comprising a series inductor followed by a RC parallel impedance in the example) is coupled, an output voltage VOUT is generated. The low side input voltage $V_{LS}$ is output from the low side driver 30 to a gate electrode of the low side n channel MOSFET MN0, while the high side input voltage VHL is output to a gate electrode, marked with G, of the high side p channel MOSFET MP0. The gate node G of the high side p channel MOSFET MP0 is coupled to the gate of a first scaled p channel MOSFET MP1, which is coupled to a voltage supply PVIN, which is a rail voltage supply in the example, through a second scaled p channel MOSFET MP2 with gate coupled to the drain, and to a floating ground, i.e., a reference low supply voltage PCLAMP, which is a floating ground of the rail supply in the example, through a current mirror MR, comprising n channel MOSFETs, which mirrors a bias current IBIAS, in the example 1 µA, by a current generator BCG coupled to its output electrode.

The supply voltage levels PVIN and PCLAMP are the supply voltage levels of a floating rail, e.g., 40V and 35V respectively as in buck converters for automotive applications. Of course, in a variant embodiment the ground can be a conventional ground, i.e., a connection to ground at 0 V. Reference to a scaled p channel MOSFET or replica MOSFET means a MOSFET with the same aspect ratio (Width/Length) of another MOSFET, in this case the high side p channel MOSFET MP0, but scaled as multiplication factor, with respect to another MOSFET, i.e., with constant radio of width and length but different, in particular smaller, values. Or in another implementation, a replica MOSFET is a MOSFET with the same length but a scaled width of another MOSFET. The switch SW1 couples the drain of the scaled p channel MOSFET MP2 to the gate of a first n channel MOSFET M1 and to the gate of a second n channel MOSFET M2 in parallel. The drain of the first n channel MOSFET M1 is fed back to the gate of the scaled p channel MOSFET MP2 and to the gate of a third n channel MOSFET M3, while the drain of the second n channel MOSFET M2 is coupled to the drain of the first p channel MOSFET M4 of a latched transistor pair LP, i.e., two p channel MOSFETs, M4 and M5, each with the gate coupled to the drain of the other.

The clamp n channel MOSFET M3 is coupled between the floating ground PCLAMP at its source and a node S1 which is the drain of the second p channel MOSFET M5 of the latched pair LP of transistors. Indeed, the MOSFETs M2 and M3 coupled to the latched pair LP complete a positive latch, as better shown in the following, i.e. a circuit which upon variation of the gate voltage $V_G$ of the high side MOSFET MP0 below a given threshold (e.g. PVIN-2Vth) has a positive feedback to bring quickly the node S1 to high logic level PVIN and bring quickly the gate voltage VG of the high side MOSFET MP0 to the floating ground PCLAMP. A switch SW2 couples the gate of the first n channel MOSFET M1 to the floating ground PCLAMP, while a switch SW3 is configured to couple and decouple the current generator BCG from the current mirror MR.

The operation of the circuit of FIG. 2 is as follows: the gate node G of the high side power MOSFET MP0 is discharged during the turn-on time Ton, i.e., the on-time of the buck converter when the high side power MOSFET MP0 is enabled, as being a p channel MOSFET it is enabled, i.e. ON, when its gate is pulled down to the floating ground PCLAMP, thus decreasing its gate voltage $V_G$. Until such gate node G reaches a gate voltage $V_G$ value of two MOSFET thresholds, corresponding to the two thresholds Vth of the two scaled p channel MOSFET MP1, MP2, below the supply voltage PVIN, the scaled p channel MOSFETs MP1 and MP2 stay in OFF condition. The MOSFET threshold Vth is substantially the minimum gate source voltage needed to create a conducting path between source and drain in the MOSFET. Below this value of two MOSFET thresholds Vth below the supply voltage PVIN, the scaled p channel MOS-FETs MP1 and MP2 begin to conduct, drawing the gate of first n channel MOSFET M1 and of the second n channel MOSFET M2 as well to the supply voltage VPIN value, so that they begin to be switched on. At the same time, the third n channel MOSFET M3, whose gate is coupled to the gate voltage $V_G$, which is decreasing, begins to turn off, releasing the drain of the MOSFET M5 of the latched pair. Also, the second n channel MOSFET M2 is on, coupled to the gate of the MOSFET M5, and contributes to turn on quickly such latched MOSFET M5, which as a consequence brings high the first feedback signal S1, thus reporting (i.e., signaling) the conclusion of the Miller plateau region. Also, the first n channel MOSFET M1 when it is turned on, brings rapidly the voltage $V_G$ to the floating ground PCLAMP, i.e., rapidly turning on the power MOSFET MP0, thus discharging it quickly and minimizing its $R_{DSon}$, as the linear region of the MP0 is entered more quickly. The second n channel MOS-FET M2 is turned ON and thanks to the latched positive loop LP the signal on node S1, i.e., the first feedback signal S1, goes up, reporting the conclusion of the Miller plateau region.

When the gate voltage $V_G$ of the high side p channel MOSFET MP0 is above the two MOSFET thresholds value 2× Vth below the supply voltage PVIN, the first n channel MOSFET M1 is also turned on determining another positive loop which allows to quickly discharge the high side power MOSFET gate MP0, minimizing its on resistance $R_{DSon}$.

The replica MOSFETs (MP1 and MP2) are sized in order to ensure that a maximum plateau value $V_{SG}$ is below the two thresholds value (2×Vth) to avoid anticipated turn-on.

The switches SW1, SW2 and SW3 are used to reset the circuit during the Toff period, i.e., the period of the high side driving signal Vas supplied to the gate G of high side p channel MOSFET MP0 during which the high side driving signal VHS is at high voltage level, e.g. VPIN and consequently the high side p channel MOSFET MP0 is off, i.e., not conducting, as explained here below.

When the signal VHS driving the high side power MOS-FET MP0 is in the Toff period, i.e., the period in which the high side power MOSFET MP0 does not conduct, the first switch SW1 is open to decouple the gate of the first n channel MOSFET M1 from the drain of the scaled p channel MOSFET MP1. The switch SW2 is then closed to couple the gate of the first n channel MOSFET M1 to the floating ground PCLAMP, so no current is drawn from n channel MOSFET M1 from the gate of the high side power MOS-FET MP0. Also, the switch SW3 coupling the bias current generator BCG to the current mirror MR is closed coupling the bias current generator BCG to the current mirror MR so that the drain of the scaled p channel MOSFET MP1 is applied to the floating ground PCLAMP voltage level. The latch LP is also reset to zero, given that now the gate voltage $V_G$ is high, thus M3 is conducting, bringing the node S1 low, i.e., to the floating ground PCLAMP voltage level. By the way, as explained in the following, the logic module 40 which receives the feedback signal S1 comprises a finite state machine 40a, which operates on the change of the feedback signal S1 from zero, or low voltage, to one, or high voltage, during Ton. Thus, it is sufficient that, during Toff, on the basis of the voltage $V_G$ value (high, in particular PVIN)

and the action of switches SW1, SW2, SW3, at some point going to zero (VCLAMP) and staying there, the switches SW1, SW2, SW3 perform the reset of the circuit 20.

This solution can be also used in drivers without slew-rate control implemented in current. The activation of the latch LP depends only from the gate voltage $V_G$ value of the power MOSFET.

Figure 3:
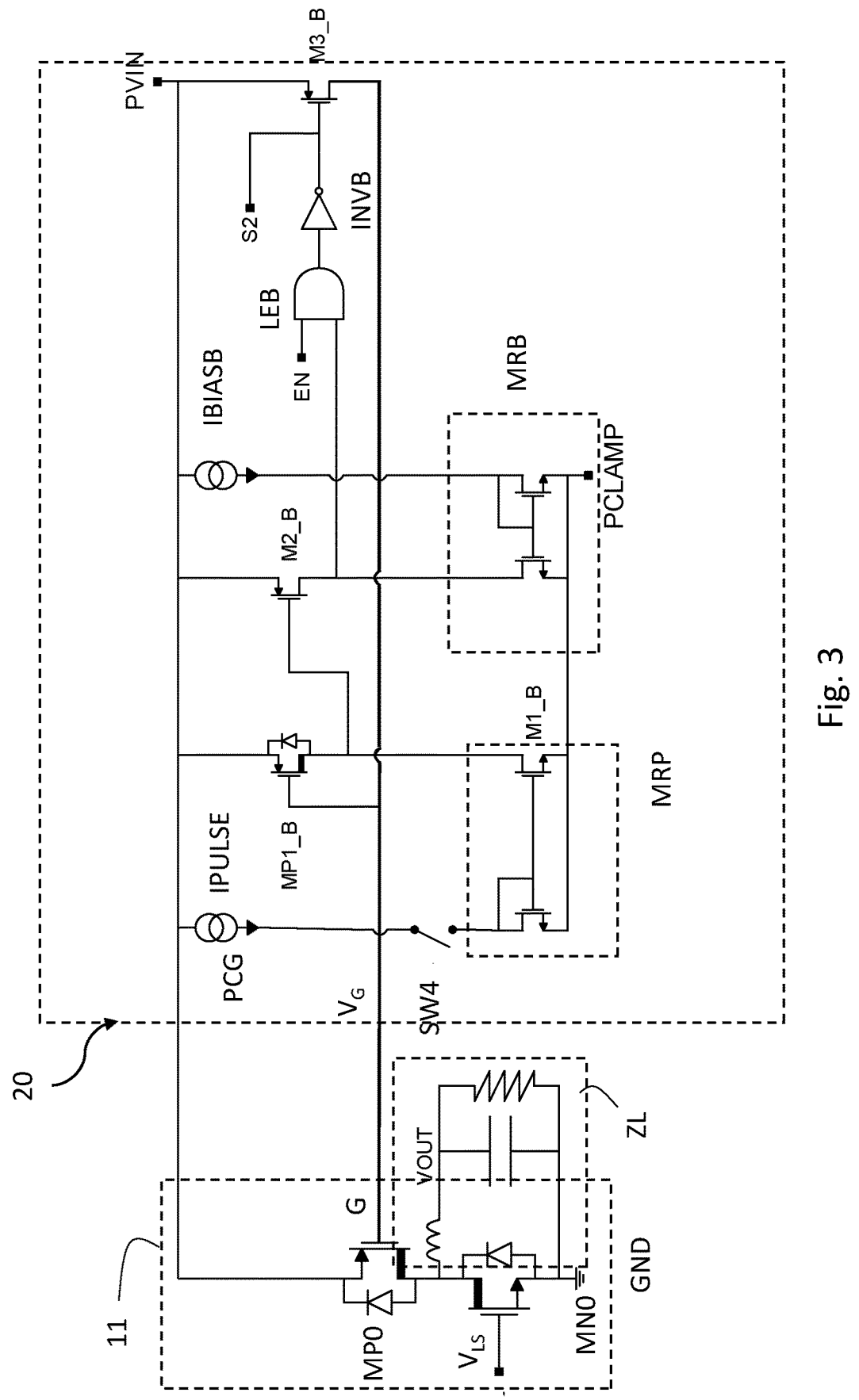
FIG. 3 represents schematically a second sub-circuit of the power driver circuit according to embodiments.

FIG. 3 shows a single threshold comparator 20, where the gate voltage $V_G$ of the high side MOSFET MP0 is applied to the gate of a scaled p channel MOSFET MP1_B.

The output on the drain of the scaled p channel MOSFET MP1_B is applied to the input gate of a second p channel MOSFET MP2_B, wherein an output at its drain is applied to a logic enabling circuit LEB, in particular an AND gate, receiving at the other input an enabling signal EN to enable the output of the p channel MOSFET M2_B to progress through an inverter INVB to the gate of the n channel MOSFET M3_B on which the second feedback signal S2 is taken. The scaled p channel MOSFET MP1_B has its drain coupled to a pulse generator PCG which sends a pulse current IPULSE through a current mirror MRP, while the second p channel MOSFET M2B receives a bias current IBIAS2 trough a current mirror MRB coupled on its drain. The transistor of the current mirror MRP coupled to the scaled p channel MOSFET MP1_B to sink its current is indicated as M1_B.

Also in this case, the commutation value must be set over the gate voltage $V_G$ plateau value in order to guarantee the correct operation of the comparator 10, this being obtained by a sizing of the scaled p channel MOSFETs MP_1, MP_2 so that they convey a current value that allows to select the power MOSFET commutation value.

At the beginning of the turn-off phase, when the high side voltage Vas is set equal to floating ground voltage PCLAMP on the gate G of the high side power MOSFET MP0, the MOSFET scaled-copy, i.e., first scaled p channel MOSFET MP1_B is conducting and supplies a current greater than the current sunk by the n channel MOSFET M1_B of the mirror MRB until the commutation value on the node G is not reached, so the drain of the scaled p channel MOSFET MP1_B and of the mirror MOSFET M1_B are kept to the voltage level of the supply voltage PVIN. Switch SW4 is closed.

Then the scaled p channel MOSFET MP1_B, to which is applied a high voltage, e.g. floating ground voltage PCLAMP, value as driving voltage VHS, discharges increasing the gate voltage $V_G$. The commutation threshold of the high side power MOSFET MP0 and hence of the scaled p channel MOSFET MP1_B, which, being the scaled replica of the high side power MOSFET MP0, has substantially the commutation threshold with respect to the Miller plateau, is reached once the plateau region of the gate voltage $V_G$ is concluded; here the scaled p channel MOSFET MP1_B and the mirror MOSFET M1_B drains are taken down to the voltage level floating ground PCLAMP, turning the p channel MOSFET M2_B on. The output of the p channel MOSFET M2_B, i.e., its drain, is generated at high voltage level, then the logic circuit LEB, if the enable signal EN is high level, outputs a high level voltage, turned to a low voltage, i.e. VCLAMP, at the output of the inverter INVB. Thus, the second feedback signal S2 is driven low and kept to the floating ground PCLAMP voltage level. The circuit 20 thus behaves as a current comparator.

The commutation of the second feedback signal S2 to low voltage level allows to turn on the third MOSFET M3_B, which quickly brings the high side power MOSFET gate MP0 to the level of the supply voltage PVIN, completing its turn-off.

During the turn-on period of the high side power MOSFET gate MP0, i.e. VHS=PCLAMP, the enable signal EN is set low, thus switching off the third MOSFET M3_B, which thus does not influence the gate voltage $V_G$. The switch SW4 is open, so that the drain of the p channel MOSFET M2_B is brought to the supply voltage PVIN, thus resetting the condition at the beginning of the turn-off period indicated above.

Figure 4:
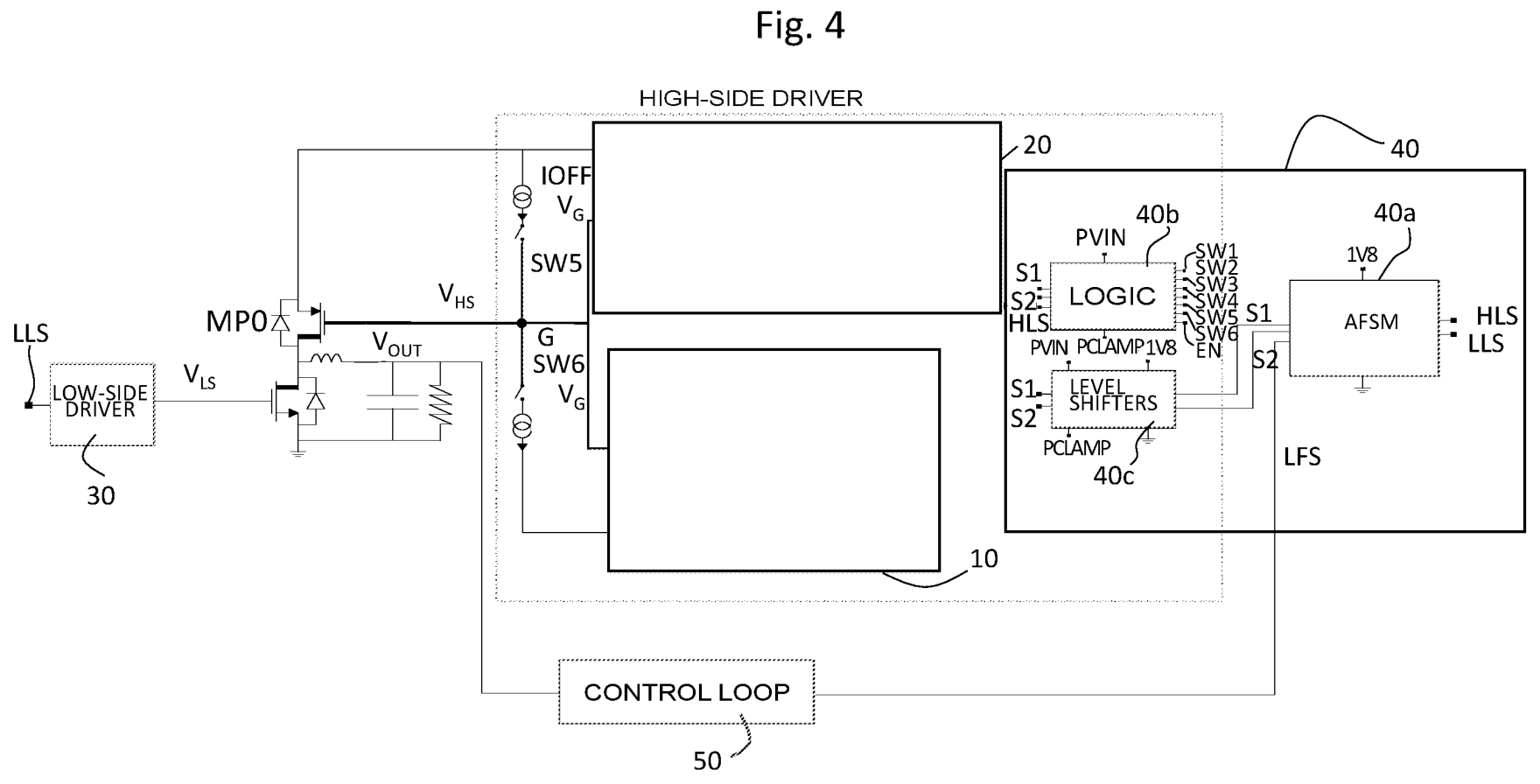

FIG. 4 shows a detailed embodiment of the logic module 40 for the architecture 80.

The logic module 40 comprises a finite state machine 40a, a comparator signal logic 40b and a level shifter module 40c.

The feedback signal S1 and S2 from comparators 10 and 20 are supplied to the finite state machine 40a through the level shifter module 40c which is configured to shift the voltage levels from the supply domains of signals S1, S2, i.e. floating rail between PVIN and PVCLAMP to the supply domain of the signal of the finite state machine 40a, 1V8 (i.e., 1.8 V) and GND (ground, 0 V).

The finite state machine 40a then issues the low side logic signal LLS and the high side logic signal HLS to driver blocks 30 and 60 respectively. The low side logic signal LLS and the high side logic signal HLS represent the activation signal for the switch on and switch of the low side power MN0 and high side power MP0 respectively, generated by the finite state machine 40a.

The comparator signal logic 40b receives the feedback signal S1, S2 and the high side logic signal HLS and generates the signals driving the opening and closure state of the switches SW1-SW6 and enable signal EN. In particular, a switch SW5 selectively couples an off current generator IOFF to inject current in node G and a switch SW5 selectively couples an ON current generator to draw current from node G. Switches SW5 and SW6 are driven with complementary signals in opposite states in PWM driving schematics to drive the gate G of the high side MOSFET MP0. Each couple switch-generator, e.g., SW5 IOFF, may be embodied by a MOSFET switch.

Thus, the solution described here refers in general to a power MOSFET driver circuit arrangement, e.g. 80, comprising a power MOSFET driver, e.g. 11 comprising at least a power MOSFET, preferably two complementary MOSFET MP0, MN0, controlled in its switching states by a switching signal, e.g., $V_{HL}$, $V_{SL}$, applied at its gate electrode G, arranged to operate between two DC voltage levels comprising a high DC voltage level, e.g. PVIN and a low DC voltage level, e.g. PCLAMP, in particular a DC supply voltage PVIN and a lower DC reference voltage PCLAMP, which is in particular a floating ground.

Such at least one power MOSFET, e.g. MP0, has gate voltage $V_G$ which value as a function of time presents a plateau $V_{SG}$, in particular a Miller plateau, when upon a transition in said switching signal, e.g. $V_{HL}$; $V_{SL}$ switching from one DC voltage level, e.g. high or low, to the other, e.g. low or high, such power MOSFET MP0, MN0 switches conduction state, from an ON to an OFF state or vice versa, depending on the transition and the type, p channel or n channel, of the power MOSFET. It is underlined that the comparator 20 operates on the transition from high to low of the switching node, switching OFF the MOSFET MP0 to detect the plateau, while the comparator 10 operates on the transition from low to high of the switching node, switching ON the MOSFET MP0.

Such power MOSFET driver circuit 11 comprises a feedback circuit 60 configured to supply a feedback signal, e.g. S1 or S2 or both as in the exemplary embodiment, signaling, when, following the transition of the switching signal $V_{HL}$, $V_{SL}$, the gate voltage $V_G$ of at least a power MOSFET, e.g. MP0, of said power MOSFET driver 11, i.e., the one or ones coupled to the feedback circuit 60, crosses such plateau value $V_{SG}$ and switches conduction state, i.e. in the example shown detection is performed only on the p channel MOSFET MP0 although the other or both MOSFET MP0, MN0 could be subject to detection of the plateau crossing.

The feedback circuit 60 comprises: one or more comparator circuits (i.e., it can comprise only comparator 20 or comparator 10 or both, although in embodiments used of only comparator 20 may be sufficient for most of the control applications) comprising at least a MOSFET, e.g. MP1, MP2 or MP1_B which is a replica of such at least one power MOSFET, e.g., MP0, i.e. the one subject to plateau crossing detection coupled to the comparator or comparators, with scaled down dimensions, whose gate is coupled to the gate electrode G of such least one power MOSFET, e.g. MP0; and a bistable circuit, i.e., substantially M2, M3, M4, M5 for comparator 20 and LEB, INVB for comparator 10, which input is coupled to an output of said MOSFET MP1 or M1_B replica of said at least one power MOSFET, e.g., MP0, configured to change the logic state of an output feedback signal, i.e. S1 and/or S2, when, following the transition of said switching signal $V_{HL}$, $V_{SL}$, i.e. the signal driving the power MOSFET, for instance by currents IOFF, ION through switches SW5, SW6, such at least one power MOSFET, e.g. MP0, coupled to the comparator or comparators, crosses said plateau value $V_{SG}$ and switches conduction state, in the example in particular going in the conduction state.

The power MOSFET driver circuit arrangement also provides that such one or more comparator circuits, 10 and/or 20, comprises a circuit, e.g., MOSFET M1 for comparator 20, MOSFET M3_B for comparator 10, having an input that is coupled to an output, in the example the drain, of said MOSFET, e.g. MP1 or M1_B, replica of said at least one power MOSFET, e.g. MP0, configured to couple said gate electrode G to the DC voltage level, e.g. PCLAMP, PCLAMP reached by said switching signal $V_{HL}$ or $V_{SL}$ after said transition, in the example the floating ground PCLAMP for two threshold comparator 20 and supply voltage PVIN for the single threshold comparator 10.

In embodiments, the feedback circuit 60 comprises: a comparator circuit 10 comprising two MOSFETs, e.g. MP1 or M1_B, which are a replica of said at least one power MOSFET, e.g. MP0, subject to detection, a first MOSFET, e.g. MP1, whose gate is coupled to the gate electrode G of said at least one power MOSFET, e.g. MP0, MN0, and a second MOSFET MP2 coupled in series between said first MOSFET MP1 and the DC voltage level corresponding to the OFF level for said at least one power MOSFET, e.g. MP0, coupled to the comparator, in the example this being high voltage PVIN; and the bistable circuit comprises a bistable latch, i.e. MOSFETs M4, M5 coupled in a latch or flip-flop cross coupled configuration, which inputs are coupled to the gate and to the output, in the example the drain, of said first MOSFET MP1 replica respectively, said output feedback signal, e.g. S1, being taken on an output of said bistable latch M4, M5, i.e. one of the output of the latch or flip flop structure. As shown the inputs of the bistable latch are coupled to the gate and output of the replica MOSFET which voltages command the opening and closure of MOSFET M2, M3 behaving like a switch to couple M4, M5 to the ON voltage, in the example VCLAMP (their sources being coupled to the OFF DC voltage, PVIN).

Also, the circuit which input is coupled to an output of said MOSFET, i.e., MP1, replica of said at least one power MOSFET, e.g. MP0, configured to couple said gate electrode G to the DC voltage level, in the example PCLAMP reached by said switching signal, e.g. $V_{HL}$, after said transition comprises a MOSFET M1, in the example n channel MOSFET, coupling said output of said MOSFET replica, i.e. MP1, to the ON DC voltage level of said at least one power MOSFET, e.g. MP0.

In embodiments, the feedback circuit 60 may also comprise a comparator circuit 10, or the comparator 10 alone, comprising only one MOSFET, e.g., MP1_B, which is a replica of said at least one power MOSFET, e.g. MP0, whose gate is coupled to the gate electrode G of said at least one power MOSFET, e.g. MP0, and a bistable circuit which comprises an inverting circuit, comprising substantially the inverter INVB, which input is coupled to the output of logic enabling circuit LEB the feedback signal S2 being taken at the output of said inverting circuit, i.e. INVB; the circuit which input is coupled to an output of said replica MOSFET, i.e., M1_B, configured to couple said gate electrode G to the DC voltage level reached by said switching signal ($V_{HL}$; $V_{SL}$) following said transition from one DC voltage level to the other, comprising a MOSFET, in the example p channel MOSFET M3_B, coupling said gate of said at least one power MOSFET, e.g. MP0 to the OFF DC voltage level of said at least one power MOSFET, e.g., MP0, PVIN in the example, the gate of such MOSFET, i.e. M3_B, being coupled to said output of said replica MOSFET, MP1_B, replica through said inverting circuit, i.e. substantially INVB, although coupling with MOSFET, MP1_B involves also n channel MOSFET M2_B coupled to the replica MOSFET output and enable circuit LEBD, which as whole identify an inverting circuit.

As indicated, providing a MOSFET, e.g. MP1, MP2 or MP1_B, which is a replica of the power MOSFET, e.g. MP0, coupled to the comparator or comparators, with scaled down dimensions, means that the replica MOSFET is configured with a scaled aspect ratio, and in particular configured to have a Miller plateau with substantially same parameters, in particular same Miller plateau voltage and gate charge which is necessary to remove or bring to go below or above said Miller plateau with the gate voltage. By way of example, the replica MOSFET will have similar threshold voltage and over-drive voltage of the power MOSFET with a scaled current flowing into it.

Then, the replica MOSFETs are sized in order to ensure that a maximum Miller plateau voltage value $V_{SG}$ falls below, in the example, the two thresholds-value (2×Vth) to avoid anticipated turn-on, in case of the single threshold comparator 10 below the single threshold value.

Figure 5:
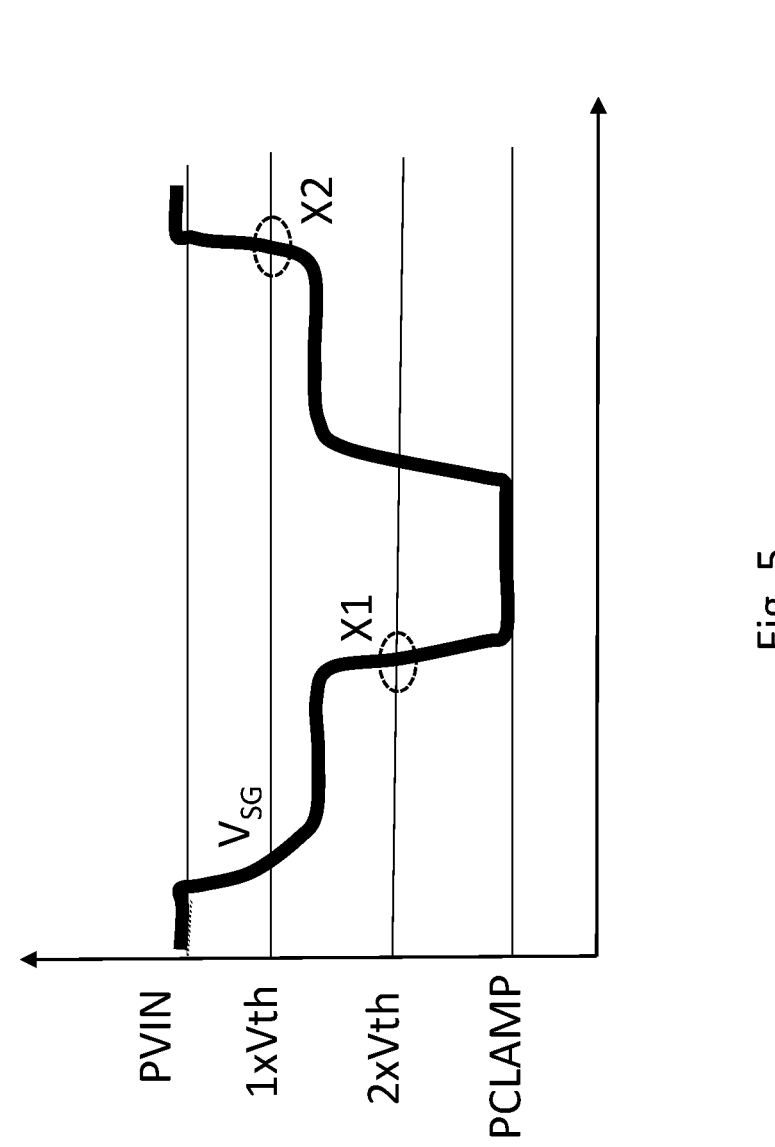
FIG. 5 is a time diagram representing the evolution of a gate voltage of a transistor of the power driver circuit according to embodiments.

FIG. 5 shows a time diagram illustrating the gate voltage $V_G$ as a function of time T. Starting from the voltage supply PVIN value the gate voltage $V_G$ decreases crossing at a crossing time X1 the two threshold (below PVIN) value 2×Vth. The Miller plateau voltage value $V_{SG}$ occurs between the two thresholds 1×Vth and 2×Vth, to which the gate voltage of the MOSFET is actually clamped and remains there until sufficient charge has been added or removed for the power MOSFET to switch. After that, the gate voltage is completely pulled down to PCLAMP floating rail and the power MOSFET MP0 is completely ON. During power-off of power MOSFET MP0 there is the opposite transition and again the Miller plateau between the two thresholds. It is thus also indicated a second crossing time X2 when then the gate voltage $V_G$ crosses the single threshold, 1×Vth value. After that, the gate voltage could be completely pulled up to PVIN to have the power MOSFET MP0 completely OFF.

It is clear that corresponding comparators 10 or 20 may be applied also to the n power MOSFET MN0, providing replica MOSFET of the same polarity, i.e. n channel MOSFET. Also instead n channel MOSFET such as M1, M2, M3 or M1_B and p channel MOSFET such as M4, M5 or M3_B may be replaced by opposite polarity/channel MOSFETs. Also, the coupling to the high or low DC voltage may be swapped according to the change of MOSFET type, as it is known to the person skilled in the art.

Thus, in this case the solution is directed to a power MOSFET driver circuit arrangement like the one described in previous embodiments wherein, however, said at least one power MOSFET is a n channel MOSFET, said ON DC level is a high DC voltage, in particular the high DC voltage supply voltage, said OFF DC level is low DC voltage, in particular ground or floating ground.

Figure 6:
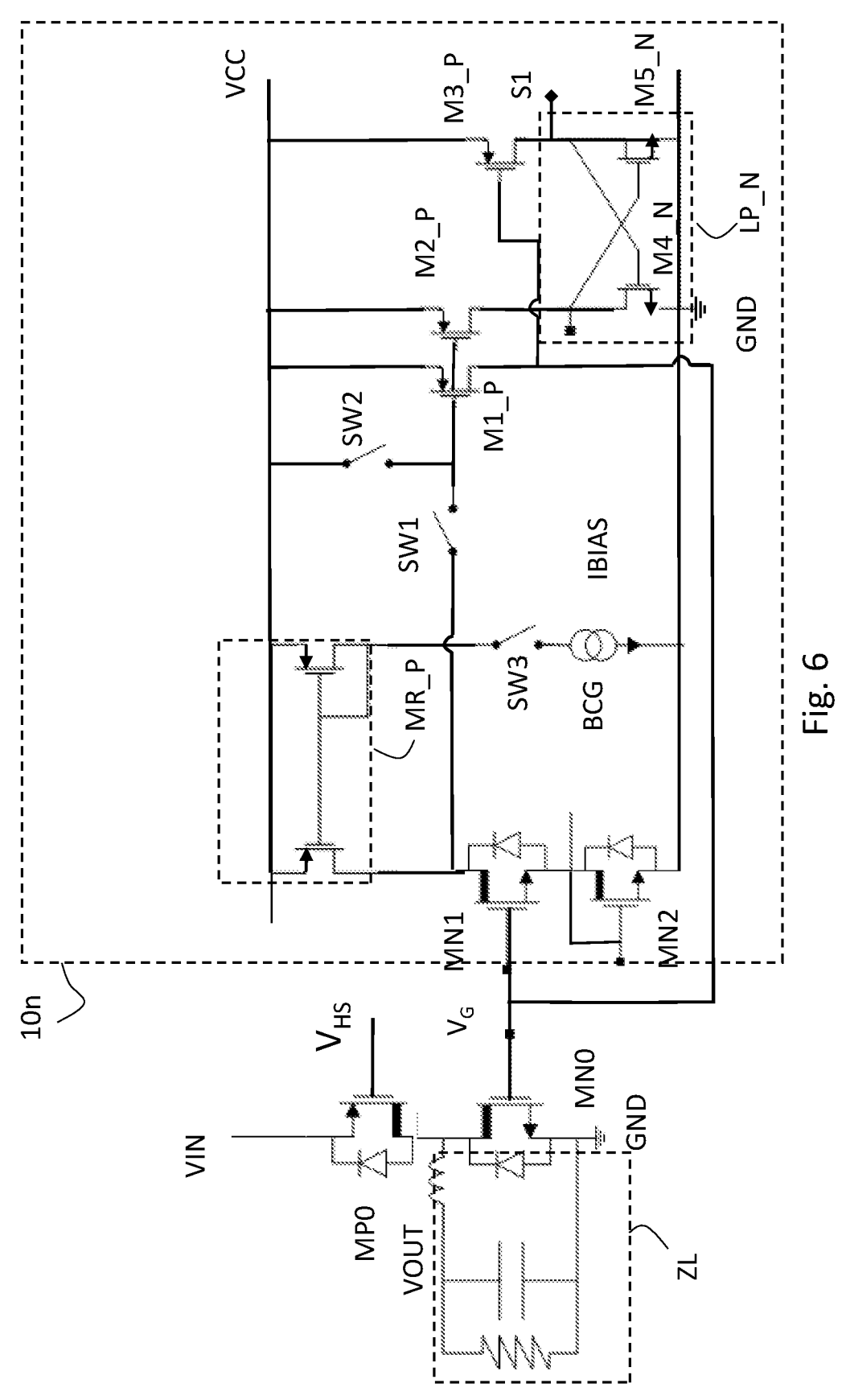
FIG. 6 represents schematically a dual embodiment of the first sub-circuit of FIG. 2 configured to operate with the low side transistor of the driver.

To this regard FIG. 6 schematically represents a dual embodiment of the circuit of FIG. 2, the circuit architecture of the two-threshold comparator, indicated with 10n, configured to operate with the low side transistor of the driver, i.e. the low side n channel MOSFET MN0, on which common node OUT, on which as in FIG. 2 an output load ZL is shown coupled, is taken the output voltage VOUT. The high side input voltage VHS is received from an equivalent of block 30 for the high side to a gate electrode of the high side p channel MOSFET MP0, while the low side input voltage VLS is applied to a gate electrode, marked with G, of the low side n channel MOSFET MN0. The gate node G of the low side n channel MOSFET MN0 is coupled to the gate of a first scaled n channel MOSFET MN1, which is coupled to a ground GND through a second scaled n channel MOSFET MN2 with gate coupled to the drain, and to ground GND, which in in this case a low DC level, but not a floating ground, through a current mirror MR_P, with p channel MOSFETS, which mirrors the bias current IBIAS, by the current generator BCG. The clamp p channel MOSFET M3_P is coupled between the supply voltage VCC at its source and a node S1 which is the drain of the second n channel MOSFET M5_N of the latched pair LP_N. A switch SW2 couples the gate of the first p channel MOSFET M1_P to the voltage supply VCC while a switch SW3 is configured to couple and decouple the current generator BCG from the current mirror MR_P.

Figure 7:
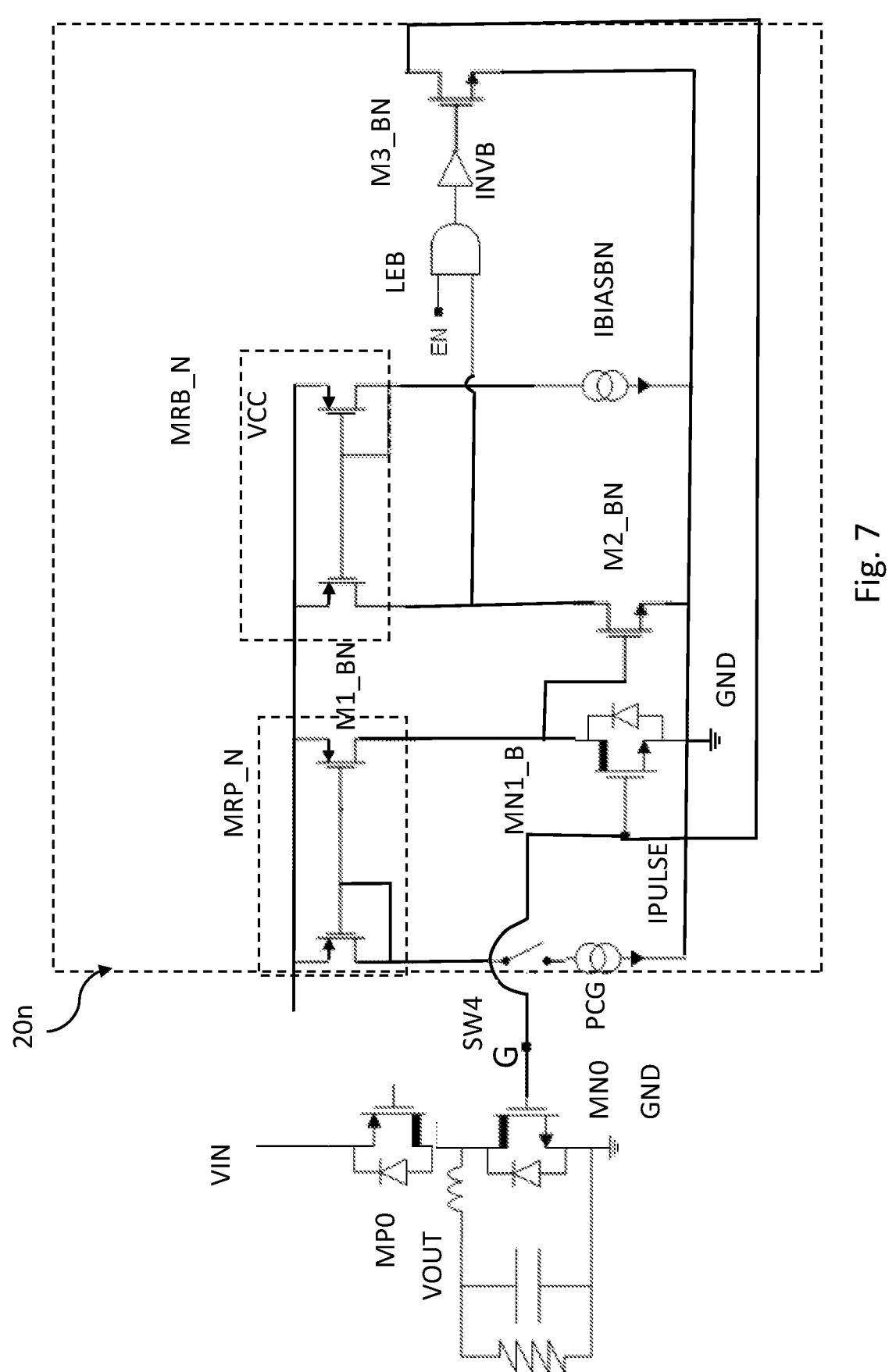
FIG. 7 represents schematically a dual embodiment of the second sub-circuit of FIG. 3 configured to operate with the low side transistor of the driver.

FIG. 7 schematically represents a dual embodiment of the second sub-circuit of FIG. 3, i.e. single threshold comparator, configured to operate with the low side transistor of the driver, i.e. the low side n channel MOSFET MN0, indicated with the reference 20n.

There, the gate voltage $V_G$ of the low side MOSFET MP0 is applied to the gate of a scaled n channel MOSFET MN1_B.

The output on the drain of the scaled n channel MOSFET MN1_B is applied to the input gate of a second n channel MOSFET M2_BN, which output on the drain is applied to a logic enabling circuit LEB, in particular an AND gate, receiving at the other input an enabling signal EN to enable the output of the n channel MOSFET M2_BN to progress through an inverter INVB to the gate of the n channel MOSFET M3_BN on which the second feedback signal S2 is taken. The scaled n channel MOSFET MN1_B has its source coupled to ground GND and to a pulse generator PCG which sends a pulse current IPULSE through a current mirror MRN, comprising n channel MOSFETS, while the second n channel MOSFET M2_BN receives a bias current IBIAS2 through a current mirror MRB_N, again comprising n channel MOSFETS, coupled on its drain. The transistor of the current mirror MRP_N coupled to the scaled n channel MOSFET MN1_B to sink its current is indicated as M1_BN.

Thus, in this case, differently from FIG. 3, the voltage levels are voltage supply VCC, e.g. 5V, and GND, e.g., 0V. The current mirrors, as said are p channel MOSFET mirrors coupled to the VCC, while in the high side embodiments are n channel MOSFET mirrors coupled to the floating ground PCLAMP.

With reference to FIGS. 6 and 7, it is clear that the architecture of a circuit arrangement of a driver with feedback using such comparators 10' and 20' coupled to the n channel MOSFET MN00 is dual with respect to that of FIG. 1. Thus, instead of the low side drivers block 30 supplying the low side input voltage $V_{LS}$ to the low side power MOSFET MN0, there is a corresponding low side drivers block supplying the low side driving voltage $V_{LS}$ to the gate of the low side power MOSFET MN0, under the control of a logic, corresponding to logic 40, which receives from the comparator 10' the signal S1, from the comparator 20' the signal S2, and the loop feedback signal LFS. The logic module 40 in this case issues the low side logic signal LLS to the block, equivalent of block 60 in FIG. 1, comprising the comparators 10' and 20', while the high side logic signal HLS is driving the high side drivers, i.e. the dual of block 30 of FIG. 1.

In the example shown with reference to FIGS. 1, 2, 3, 4 the high voltage PVIN is the switch OFF voltage of p channel MOSFET MP0 (and the other p channel MOS-FETs), i.e., applied to its gate as command signal switches off MP0, which begins to cease conducting, while the low voltage PCLAMP is the switch ON voltage of p channel MOSFET MP0, i.e., applied to its gate as command signal switches on MP0, which begins to go in conduction state. When the comparators 10 and/or 20 are coupled to the gate of n power MOSFET MN0, it is operated with reference to actual ground, thus GND is the switch OFF voltage (also of the other n channel MOSFETS) and an internal supply, which may be derived from PVIN, is the switch ON voltage.

The solution then may allow implementing a control method of a power MOSFET driver arrangement according to embodiments, comprising feeding the first feedback signal, S1, and/or second feedback signal S2, to a logic control module, e.g. 40, controlling the operation of the driver 11, e.g. the signals driving switches M5, M6, respectively, in particular according to a slew rate control scheme, in particular said control module controlling also switches, e.g. SW1, SW2, SW3, SW4, setting the configuration of said feedback module 60, in particular resetting their configuration.

The control method may be comprising feeding the first feedback signal, e.g. S1 and/or second feedback signal S2, to a logic control module 40, controlling the operation of the driver 11, according to a slew rate control scheme or other control.

In particular, such signals S1 and S2 may be supplied to the finite state machine, e.g. 40a, issuing from the finite state machine 40a the low side logic signal LLS and the high side logic signal HLS activating the switch on and switch off of the low side power MOSFET MN0 and high side power MOSFET MP0, e.g. the signals driving switches M5, M6, respectively, generated by the finite state machine 40a; generating, in the module 40b, on the basis of said first feedback signal S1 and/or second feedback signal S2 and of the high side logic signal HLS (or low side logic signal LLS if MOSFET M0 is under detection) corresponding to the at least one power MOSFET coupled to the feedback circuit 60 signals commanding the opening and closure state of said set of switches SW1, SW2 and, SW3, and/or SW4, to reset the corresponding comparator 10, 20 and of switches SW5, SW6 driven with complementary signals to drive the gate G of the at least one power MOSFET, e.g. MP0.

Thus, the advantages of the solution described hereabove are clear.

The circuit described uses power MOSFET replicas that ensure tracking with any threshold variation of the power MOSFET avoiding problems/mismatches in PVT variation. No trimming actions required.

The exploitation of a two-threshold value tracked with the power MOSFET, by means of a latch (positive loop) used to generate the feedback signal and quickly discharge the power MOSFET gate.

The solution described generates a feedback signal using a latch with an activation threshold that is directly linked to power MOSFET characteristic and allows also to quickly discharge the power MOSFET gate reducing power consumption.

This solution can be also used in drivers without slew-rate control implemented in current; the activation of the feedback mechanism depends only from the gate voltage $V_G$ value of the power MOSFET.

Of course, without prejudice to the principle of the invention, the details of construction and the embodiments may vary widely with respect to what has been described and illustrated herein purely by way of example, without thereby departing from the scope of the present invention, as defined by the ensuing claims.

AS mentioned, the circuit arrangement preferably comprises the two-threshold comparator (circuit 20), but may comprise both the comparators (10 and 20), or also only the one threshold comparator (circuit 10).

The circuit arrangement described may be comprised in DC-DC converters, in particular in drivers for AMOLED displays, but also in any other application using a driver with at least a power MOSFET which requires detection of the Miller plateau crossing to perform or improve control of its operation.

The claims are an integral part of the technical teaching of the disclosure provided herein.

The invention claimed is:

1. A power MOSFET driver circuit arrangement, comprising a power MOSFET driver including at least one power MOSFET having switching states controlled by a switching signal applied at a gate electrode, said at least one power MOSFET arranged to operate between a high DC voltage level and a low DC voltage level, wherein a gate voltage of said at least one power MOSFET has a value as a function of time which presents a plateau value, when said at least one power MOSFET switches its conduction state, from an ON to an OFF state or vice versa, in response to a transition in said switching signal, comprising:

a feedback circuit configured to supply a feedback signal that signals when the gate voltage of said at least one power MOSFET crosses said plateau value and said at least one power MOSFET switches conduction state in response to the transition of the switching signal;

wherein said feedback circuit comprises:

one or more comparator circuits comprising at least a replica MOSFET of said at least one power MOS-FET, with scaled down dimensions, having a gate that is coupled to the gate electrode of said at least one power MOSFET; and a bistable circuit having an input coupled to an output of said replica MOSFET, said bistable circuit configured to change a logic state of the feedback signal when the gate voltage of said at least one power MOSFET crosses said plateau value following the transition of the switching signal said at least one power MOSFET crosses said plateau value and said at least one power MOSFET switches conduction state in response to the transition of the switching signal;

wherein said one or more comparator circuits comprises a MOSFET circuit having an input coupled to an output of said replica MOSFET, said MOSFET circuit configured to couple said gate electrode of the at least one power MOSFET to a DC voltage level reached by said switching signal after said transition.

2. The power MOSFET driver circuit arrangement according to claim 1, wherein said one or more comparator circuits comprises a MOSFET circuit having an input coupled to the output of said replica MOSFET, said MOSFET circuit configured to couple said output of the replica MOSFET to an ON DC voltage level of said at least one power MOSFET.

3. The power MOSFET driver circuit arrangement according to claim 1, wherein:

said at least a replica MOSFET of the one or more comparator circuits comprises two replica MOSFETs of said at least one power MOSFET, a first one of the two replica MOSFETs having a gate is coupled to the gate electrode of said at least one power MOSFET, and a second one of the two replica MOSFET coupled in series between said first replica MOSFET and a DC voltage level corresponding to an OFF level for said at least one power MOSFET; and said bistable circuit comprises a bistable latch having inputs are coupled to the gate and to the output of said first one of the replica MOSFETs, said feedback signal being generated at an output of said bistable latch.

4. The power MOSFET driver circuit arrangement according to claim 3, further comprising a first MOSFET switch coupled to the output of the first replica MOSFET and a second MOSFET switch coupled to the gate of first replica MOSFET, wherein said inputs of the bistable latch are coupled to an ON DC voltage level of said at least one power MOSFET by the first and second MOSFET switches, respectively.

5. The power MOSFET driver circuit arrangement according to claim 4, wherein said one or more comparator circuits comprises a MOSFET circuit having an input coupled to an output of said replica MOSFET, said MOSFET circuit configured to couple said gate electrode of the at least one power MOSFET to a DC voltage level reached by said switching signal after said transition, and further comprising:

a first switch configured to couple a current generator to the output of said first replica MOSFET and to decouple said MOSFET circuit from the output of said first replica MOSFET;

wherein said current generator is configured to supply a current to bring the first replica MOSFET to the DC voltage level corresponding to the OFF level for said at least one power MOSFET and perform a reset of the one or more comparator circuits.

6. A power MOSFET driver circuit arrangement, comprising a power MOSFET driver including at least one power MOSFET having switching states controlled by a switching signal applied at a gate electrode, said at least one power MOSFET arranged to operate between a high DC voltage level and a low DC voltage level, wherein a gate voltage of said at least one power MOSFET has a value as a function of time which presents a plateau value, when said at least one power MOSFET switches its conduction state, from an ON to an OFF state or vice versa, in response to a transition in said switching signal, comprising:

a feedback circuit configured to supply a feedback signal that signals when the gate voltage of said at least one power MOSFET crosses said plateau value and said at least one power MOSFET switches conduction state in response to the transition of the switching signal;

wherein said feedback circuit comprises:

one or more comparator circuits comprising at least a replica MOSFET of said at least one power MOSFET, with scaled down dimensions, having a gate that is coupled to the gate electrode of said at least one power MOSFET; and a bistable circuit having an input coupled to an output of said replica MOSFET, said bistable circuit configured to change a logic state of the feedback signal when the gate voltage of said at least one power MOSFET crosses said plateau value following the transition of the switching signal said at least one power MOSFET crosses said plateau value and said at least one power MOSFET switches conduction state in response to the transition of the switching signal;

wherein said one or more comparator circuits comprises a MOSFET circuit having an input coupled to an output of said replica MOSFET, said MOSFET circuit configured to couple said gate electrode of the at least one power MOSFET to a DC voltage level corresponding to an OFF level for said at least one power MOSFET;

said bistable circuit comprising an inverting circuit having an input coupled to the output of said first replica MOSFET, said feedback signal being generated at an output of said inverting circuit;

wherein a gate of said MOSFET circuit is coupled to said output of said replica MOSFET through said inverting circuit.

7. The power MOSFET driver circuit arrangement according to claim 6, further comprising a switch configured to couple a current generator to the output of said replica MOSFET, said current generator configured to supply a current to bring the replica MOSFET to the OFF DC voltage level of said at least one power MOSFET and perform a reset of the one or more comparator circuits.

8. The power MOSFET driver circuit arrangement according to claim 1, wherein said replica MOSFET is configured with a scaled aspect ratio to have a Miller plateau with substantially same parameters of threshold voltage and over-drive voltage at the Miller plateau as the at least one power MOSFET.

9. The power MOSFET driver circuit arrangement according to claim 1, wherein said at least one power MOSFET is a p channel MOSFET with an ON DC voltage level at a low DC voltage and an OFF DC voltage level at a high DC voltage.

10. The power MOSFET driver circuit arrangement according to claim 1, wherein said at least one power MOSFET is an n channel MOSFET with an ON DC voltage level at a high DC voltage and an OFF DC voltage level at a low DC voltage.

11. The power MOSFET driver circuit arrangement according to claim 1, wherein said at least one power MOSFET comprises one of a high side power MOSFET receiving a low side input voltage from a low side driver or a low side power MOSFET receiving a high side driving voltage from a high side driver, said low side or high side driver comprising said feedback circuit, further comprising:

a logic module configured to receive said feedback signal and a loop feedback signal from a control loop coupled to a driver output, said logic module further configured to output a low side logic signal to the low side driver or a high side logic signal to the high side driver.

12. The power MOSFET driver circuit arrangement according to claim 11, wherein said logic module comprises a finite state machine which operates in response to change in the logic state of the feedback signal to reset said one or more comparator circuits.

13. The power MOSFET driver arrangement according to claim 12, wherein said logic module is further configured to receive the feedback signal and control operation of the driver according to a slew rate control scheme and control setting of a configuration of said feedback circuit.

14. The power MOSFET driver arrangement according to claim 12, wherein said finite state machine is configured to:

issue a logic signal activating a switching on and off of the at least one power MOSFET;

generate in response to the feedback signal and the logic signal a control for resetting the one or more comparators.

15. A circuit, comprising:

a driver circuit configured to drive a gate of a power MOSFET with a switching signal, wherein said power MOSFET has a gate voltage that transitions as a function of time, in response to a transition in said switching signal, and presents a plateau value;

a comparator circuit comprising:

a first replica MOSFET of said power MOSFET with scaled down dimensions having a gate coupled to a gate of said power MOSFET;

a bistable latch having a first input and a second input and an output configured to generate a feedback signal;

a first MOSFET circuit having a gate coupled to an output of the first replica MOSFET and configured to couple the gate of said power MOSFET to a first DC voltage level;

a second MOSFET circuit having a gate coupled to the output of the first replica MOSFET and configured to couple the first input of the bistable latch to the first DC voltage level; and a third MOSFET circuit having a gate coupled to the gate of the power MOSFET and configured to couple the second input of the bistable latch to the first DC voltage level; and a logic circuit configured to receive the feedback signal from the bistable latch and generate the switching signal for the power MOSFET.

16. The circuit of claim 15, wherein said comparator circuit further comprises a second replica MOSFET of said power MOSFET with scaled down dimensions, said second replica MOSFET coupled in series between the first replica MOSFEDT and a second DC voltage level.

17. The circuit of claim 15, wherein said comparator circuit further comprises:

a current source configured to generate a bias current;

a first switch configured to selectively apply the bias current to the output of the first replica MOSFET;

a second switch configured to selectively couple the output of the first replica MOSFET to the gates of the first and second MOSFET circuits; and a third switch configured to selectively couple the gates of the first and second MOSFET circuits to the first DC voltage level.

18. A circuit, comprising:

a driver circuit configured to drive a gate of a power MOSFET with a switching signal, wherein said power MOSFET has a gate voltage that transitions as a function of time, in response to a transition in said switching signal, and presents a plateau value;

a comparator circuit comprising:

a replica MOSFET of said power MOSFET with scaled down dimensions having a gate coupled to a gate of said power MOSFET;

a bistable circuit having an input coupled to an output of said replica MOSFET and an output configured to generate a feedback signal;

a first current source configured to generate a first bias current;

a first MOSFET circuit having a gate coupled to an output of the bistable circuit and configured to couple the gate of said power MOSFET to a first DC voltage level; and a second MOSFET circuit configured to selectively apply the first bias current to the output of the replica MOSFET and couple the output of the replica MOSFET to a second DC voltage level; and a logic circuit configured to receive the feedback signal from the bistable circuit and generate the switching signal for the power MOSFET.

19. The circuit of claim 18, wherein said comparator circuit further comprises:

a third MOSFET circuit having a gate coupled to an output of the replica MOSFET and coupled to a second DC voltage level;

a second current source configured to generate a second bias current; and a fourth MOSFET circuit configured to selectively apply the second bias current to an output of the third MOSFET circuit and couple the output of the third MOSFET circuit to a second DC voltage level;

wherein the input of the bistable circuit is coupled to the output of the fourth MOSFET circuit.

20. The circuit of claim 19, wherein the bistable circuit comprises:

a logic AND gate having a first input coupled to receive an enable signal and a second input coupled to the output of the fourth MOSFET circuit; and an inverter having an input coupled to an output of the logic AND gate and an output generating the feedback signal.

* * * * *